United States Patent
Yoon

(10) Patent No.: US 9,437,665 B2
(45) Date of Patent: Sep. 6, 2016

(54) ORGANIC LIGHT-EMITTING DISPLAY APPARATUS

(71) Applicant: Samsung Display Co., Ltd., Yongin, Gyeonggi-Do (KR)

(72) Inventor: Joo-Sun Yoon, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/243,772

(22) Filed: Apr. 2, 2014

(65) Prior Publication Data

US 2015/0060783 A1  Mar. 5, 2015

(30) Foreign Application Priority Data

Aug. 28, 2013  (KR) .................. 10-2013-0102659

(51) Int. Cl.
*H01L 27/32* (2006.01)
*H01L 51/52* (2006.01)

(52) U.S. Cl.
CPC ..... *H01L 27/3276* (2013.01); *H01L 2227/323* (2013.01)

(58) Field of Classification Search
CPC ........... H01L 27/3276; H01L 51/5253; H01L 51/56; H01L 51/5203; H01L 51/5218
See application file for complete search history.

(56) References Cited

U.S. PATENT DOCUMENTS

| | | | |
|---|---|---|---|
| 2002/0084311 | A1 | 7/2002 | Barth |
| 2007/0002222 | A1* | 1/2007 | Lim .................. G02F 1/133555 349/114 |
| 2008/0079006 | A1 | 4/2008 | Park et al. |
| 2010/0176394 | A1 | 7/2010 | Park et al. |
| 2010/0301366 | A1* | 12/2010 | Takahashi ........... H01L 27/3276 257/98 |
| 2013/0001564 | A1* | 1/2013 | Choi ................... H01L 27/3276 257/59 |

FOREIGN PATENT DOCUMENTS

| | | |
|---|---|---|
| KR | 10-0542120 | 1/2006 |
| KR | 10-2006-0057970 | 5/2006 |
| KR | 10-2008-0030210 | 4/2008 |
| KR | 10-2010-0082941 | 7/2010 |
| KR | 10-2013-0007050 | 1/2013 |

* cited by examiner

*Primary Examiner* — Latanya N Crawford
(74) *Attorney, Agent, or Firm* — Innovation Counsel LLP

(57) ABSTRACT

Disclosed is an organic light-emitting display apparatus. The organic light-emitting display apparatus includes a pixel electrode that is connected to at least one thin film transistor, an opposite electrode that is disposed to face the pixel electrode, an organic light emitting layer that is disposed between the pixel electrode and the opposite electrode, and a pad electrode that includes a first pad layer, a second pad layer disposed on the first pad layer, and a third pad layer which is disposed between the first pad layer and the second pad layer and contains a material having a reducibility that is lower than a reducibility of a material contained in the second pad layer.

7 Claims, 6 Drawing Sheets

ORGANIC LIGHT-EMITTING DISPLAY APPARATUS

RELATED APPLICATIONS

This application claims the benefit of Korean Patent Application No. 10-2013-0102659, filed on Aug. 28, 2013, in the Korean Intellectual Property Office, the disclosure of which is incorporated herein in its entirety by reference.

BACKGROUND

1. Field

One or more embodiments of the inventive concept relate to an organic light-emitting apparatus.

2. Description of the Related Art

Organic light-emitting apparatuses are self-emitting display apparatuses that include a hole injection electrode, an electron injection electrode, and an organic light emitting layer formed between the hole injection electrode and the electron injection electrode. Holes injected from the hole injection electrode and electrons injected from the electron injection electrode are recombined and dissipated at the organic light emitting layer to emit light. Organic light-emitting display apparatuses show excellent characteristics such as low power consumption, high luminance, and a fast response time, and thus are attracting a lot of attention.

SUMMARY

One or more embodiments of the inventive concept include a high-grade organic light-emitting display apparatus.

Additional aspects will be set forth in the description which follows and will be apparent from the description, or may be learned by practice of the presented embodiments.

According to one or more embodiments of the inventive concept, an organic light-emitting display apparatus includes: a pixel electrode that is connected to at least one thin film transistor; an opposite electrode that is disposed to face the pixel electrode; an organic light emitting layer that is disposed between the pixel electrode and the opposite electrode; and a pad electrode that comprises a first pad layer, a second pad layer disposed on the first pad layer, and a third pad layer which is disposed between the first pad layer and the second pad layer and contains a material having a reducibility that is lower than a reducibility of a material contained in the second pad layer.

The pad electrode may further include a fourth pad layer that contains transparent conductive oxide and is disposed between the first pad layer and the third pad layer.

The pad electrode may further include a fifth pad layer that contains transparent conductive oxide and is disposed on the second pad layer.

The second pad layer may contain a reflective material.

The second pad layer may contain silver (Ag).

The first pad layer may contain copper.

The pixel electrode may include a first layer that contains the same material as the second pad layer.

The pixel electrode may include a second layer that contains the same material as the third pad layer.

The organic light-emitting display apparatus may further include an insulating layer that covers edges of each of the second pad layer and third pad layer.

According to one or more embodiments of the inventive concept, an organic light-emitting display apparatus includes: a plurality of pixel electrodes that are connected to at least one thin film transistor; an opposite electrode that is disposed to face the plurality of pixel electrode; an organic light emitting layer that is disposed between at least one of the pixel electrodes and the opposite electrode; a light adjusting layer that is disposed between at least one of the plurality of pixel electrodes and the organic light emitting layer; and a pad electrode that comprises a first pad layer, a second pad layer disposed on the first pad layer, a third pad layer which is disposed between the first pad layer and the second pad layer and contains a material having a reducibility that is lower than a reducibility of a material contained in the second pad layer, and a light adjusting layer disposed on the second pad layer.

The light adjusting layer contains a transparent conductive oxide.

A plurality of light adjusting layers, which are respectively disposed at different pixels among the plurality of pixels, have different thicknesses.

The pad electrode may further include a fourth pad layer that contains transparent conductive oxide and is disposed between the first pad layer and the third pad layer.

The pad electrode may further include a fifth pad layer that contains transparent conductive oxide and is disposed on the second pad layer.

The second pad layer may contain a reflective material.

The second pad layer may contain silver (Ag).

The first pad layer may contain copper.

The pixel electrode may include a first layer that contains the same material as the second pad layer.

The pixel electrode may include a second layer that contains the same material as the third pad layer.

The opposite electrode may be a semi-transmissive electrode.

The organic light-emitting display apparatus may further include an insulating layer that covers edges of each of the second pad layer and third pad layer. The light adjusting layer is disposed on the insulating layer.

In addition to the aforesaid details, other aspects, features, and advantages will be clarified from the following drawings, claims, and detailed description.

BRIEF DESCRIPTION OF THE DRAWINGS

These and/or other aspects will be apparent and more readily appreciated from the following description of the embodiments, taken in conjunction with the accompanying drawings of which.

DETAILED DESCRIPTION

Figure 1:
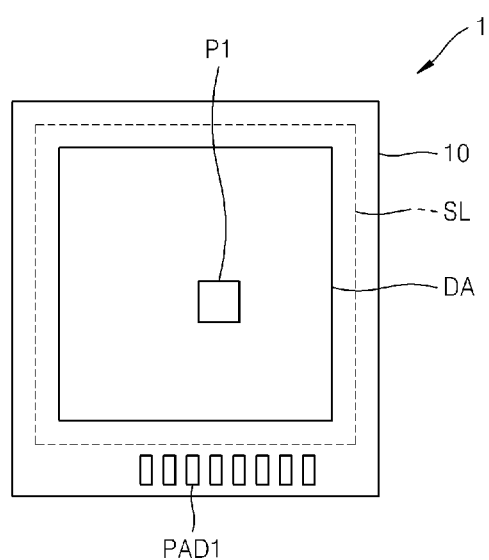
FIG. 1 is a plan view schematically illustrating an organic light-emitting display apparatus according to a first embodiment of the inventive concept.

Reference will now be made in detail to embodiments, examples of which are illustrated in the accompanying drawings, wherein like reference numerals refer to the like elements throughout the specification. In this regard, the present embodiments may have different forms and should not be construed as being limited to the descriptions set forth herein. Accordingly, the embodiments are merely described below, with reference to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The inventive concept can impose various transformations that can have various embodiments, and specific embodiments illustrated in the drawings will be described in detail in the detailed description. The effects and features of the inventive concept will become apparent from the following description of the embodiments with reference to the accompanying drawings, which is set forth hereinafter. The inventive concept may, however, be embodied in different forms and should not be construed as being limited to the embodiments set forth herein.

Hereinafter, embodiments of the inventive concept will be described in detail with reference to the accompanying drawings. In addition, in the present specification and drawings, like reference numerals refer to like elements throughout the specification, and thus, redundant descriptions may be omitted.

In the following embodiments, the terms "first" and "second" are for differentiating one element from another element, and these elements should not be limited by these terms.

In the following embodiments, the singular forms "a", "an" and "the" are intended to include the plural forms as well, unless the context clearly indicates otherwise.

In the following embodiments, it should be further understood that the terms "comprises", "comprising", "has", "having", "contains", "containing" "includes" and/or "including", when used herein, specify the presence of stated features, integers, steps, operations, elements, and/or components, but do not preclude the presence or addition of one or more other features, integers, steps, operations, elements, components, and/or groups thereof.

In the following embodiments, when an element such as a layer or a region is referred to as being "on" another element, this includes a case where one element is disposed between other elements, in addition to a case where one element is disposed directly on the other element.

In the drawings, the dimensions of layers and regions are exaggerated or reduced for clarity of illustration. For example, a dimension and thickness of each element in the drawings are arbitrarily illustrated for clarity, and thus, embodiments of the inventive concept are not limited thereto.

Figure 2:
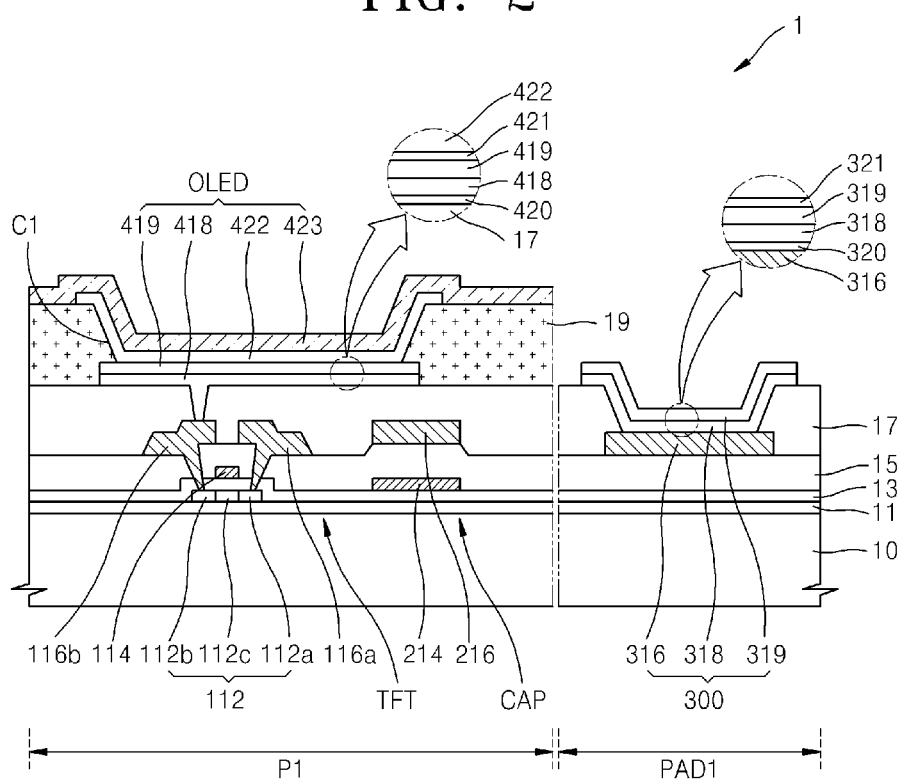
FIG. 2 is a cross-sectional view schematically illustrating a pixel and a pad unit of the organic light-emitting display apparatus according to a first embodiment of the inventive concept.

FIG. 1 is a plan view schematically illustrating an organic light-emitting display apparatus 1 according to a first embodiment of the inventive concept, and FIG. 2 is a cross-sectional view schematically illustrating a pixel P1 and a pad unit PAD1 of the organic light-emitting display apparatus 1 according to a first embodiment of the inventive concept.

Referring to FIG. 1, the organic light-emitting display apparatus 1 according to a first embodiment of the inventive concept includes a substrate 10, and a display area DA is formed on the substrate 10. The display area DA includes a plurality of pixels P1 and displays an image. The display area DA is surrounded by a sealing line SL and includes an encapsulation member (not shown) that encapsulates the display area DA.

Referring to FIG. 2, at least one thin film transistor TFT, an organic light-emitting device OLED connected to the thin film transistor TFT, at least one capacitor CAP, and at least one pad unit PAD1 are provided at the substrate 10.

The substrate 10 may include a plastic substrate including at least one of polyethylene terephthalate (PET), polyethylene naphthalate (PEN), and polyimide, in addition to a glass substrate.

A buffer layer 11, which forms a smooth surface and prevents impurities from penetrating into the TFT and OLED from the substrate 10, may be provided on the substrate 10. The buffer layer may be formed of a single layer or multilayers that include(s) an organic insulating layer such as a silicon nitride, a silicon oxide and an oxynitride, or any combinations thereof.

The at least one thin film transistor TFT is provided on the substrate 10. The thin film transistor TFT includes an active layer 112, a gate electrode 114, a source electrode 116a, and a drain electrode 116b.

The active layer 112 may include a channel region 112c, a source region 112a which is doped with ion impurities and is formed at one outer side of the channel region 112c, and a drain region 112b which is doped with ion impurities and is formed at the other outer side of the channel region 112c. The active layer 112 may be formed of various materials. For example, the active layer 112 may include an inorganic semiconductor material such as amorphous silicon, polycrystalline silicon and crystalline silicon. As another example, the active layer 112 may include an oxide semiconductor. As another example, the active layer 112 may include an organic semiconductor material.

A first insulating layer 13 that is a gate insulating layer is formed on the active layer 112, and the gate electrode 114 is provided on the first insulating layer 13 at a position corresponding to the channel region 112c.

The gate electrode 114 may be formed of a single layer or multilayers which is/are formed of one or more metals selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A second insulating layer 15 that is an interlayer insulating layer is formed on the gate electrode 114. The source electrode 116a and the drain electrode 116b are provided on the second insulating layer 15.

The source electrode 116a and the drain electrode 116b respectively contact the source region 112a and drain region 112b of the active layer 112 through an opening which is formed in the second insulating layer 15. The source electrode 116a and the drain electrode 116c may be formed of a single layer or multilayers which is/are formed of, for example, one or more metals selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The first insulating layer 13 and the second insulating layer 15 may be formed of an inorganic insulating layer. The inorganic insulating layer forming the first insulating layer 13 and the second insulating layer 15 may contain at least one of $SiO_2$, $SiN_x$, SiON, $Al_2O_3$, $TiO_2$, $Ta_2O_5$, $HfO_2$, $ZrO_2$, BST, and PZT.

A third insulating layer 17 is formed on the second insulating layer 15 to cover the source electrode 116a and the drain electrode 116b. The third insulating layer 17 may be formed of an inorganic insulating layer, an organic insulating layer, or any combinations thereof.

The organic light-emitting device OLED, which includes pixel electrodes 418 and 419 connected to the drain electrode 116b of the thin film transistor TFT, an organic light emitting layer 422, and an opposite electrode 423, is formed on the third insulating layer 17.

The thin film transistor TFT of FIG. 2 is a driving transistor that drives the organic light-emitting device OLED. The driving transistor is illustrated in FIG. 2, but the organic light-emitting display apparatus 1 according to the present embodiment may further include a switching transistor (not shown) or a threshold voltage compensation transistor (not shown).

A structure of the thin film transistor TFT of FIG. 2 is an example to which the organic light-emitting display apparatus 1 according to the present embodiment may be applied, and the present embodiment is not limited to the structure of the thin film transistor TFT of FIG. 2.

The pixel electrodes 418 and 419 may include a first layer 419 containing the same material as that of a second pad layer 319 of a pad electrode 300 to be described below, and a second layer 418 containing the same material as that of a third pad layer 318 of the pad electrode 300.

The first layer 419 of the pixel electrodes 418 and 419 may contain a reflective material. For example, the reflective material may contain silver (Ag) or a silver alloy.

The second layer 418 of the pixel electrodes 418 and 419 is disposed under the first layer 419 of the pixel electrodes 418 and 419. The second layer 418 may be disposed to directly contact a bottom of the first layer 419.

The second layer 418 may contain a material having a lower reducibility than that of a material contained in the first layer 419. For example, when the first layer 419 contains a material having a high reducibility like silver (Ag), the second layer 148 may contain a material having a lower reducibility than that of silver (Ag), such as copper (Cu) or aluminum (Al). A material having a high reducibility like silver (Ag) easily accommodates ambient electrons during an etching process of forming a pattern of the pixel electrodes 418 and 419. As a result, the silver (Ag) ions dissolved in the etchant accommodate the ambient electrons andre-precipitated as silver (Ag) particles. The re-precipitated silver (Ag) particles cause a particle defect such as a short circuit and a breakage of insulating layers in the organic light-emitting display apparatus 1 during a subsequent process.

However, in the organic light-emitting display apparatus 1 according to an embodiment of the inventive concept, the pixel electrode 418 includes a dual structure that includes the first layer 419 containing a material having a high reducibility and the second layer 418 containing a material having a lower reducibility than the first layer 419, thus reducing the particle defect caused by the re-precipitation of the silver (Ag) particles when compared to a case in which a pixel electrode is formed of a thick single structure of a material having a high reducibility, such as silver (Ag).

According to an increase in demand for large-screen display apparatuses, the size of display apparatuses becomes larger, and thus, a thickness of electrodes or wirings such as the pixel electrodes 418 and 419 or the pad layers 318 and 319 included in the display apparatuses need to become thicker in order to prevent voltage drops in the electrodes or wirings included in the display apparatus. According to an increase in thickness of the electrodes or wirings having high reproducibility, the possibility of the particle defects increases because an area exposed during the etching process is increased too. However, in the organic light-emitting display apparatus 1 according to the present embodiment, the pixel electrodes 418 and 419, the pad layers 318 and 319, and a plurality of wirings (not shown) connected to the pixel electrodes 418 and 419 are formed in a dual structure including the first layers 419 and 319 having a high reproducibility, and the second layers 418 and 318 having a low reproducibility than the first layers 419 and 319. Thus, the pixel electrodes 418 and 419, the pad layers 318 and 319, and the plurality of wirings (not shown) connected to the pixel electrodes 418 and 419 may be thickly formed without causing a particle defect due to the re-precipitated silver (Ag) particles. Accordingly, a problem of voltage drop caused by the increase of a screen size is reduced without causing a particle defect.

A third layer 420 of the pixel electrode may be further provided between the third insulating layer 17 and the second layer 418 of the pixel electrode.

The third layer 420 may contain the same material as that of a fourth pad layer 320 of the pad electrode 300 to be described below. For example, the third layer 420 of the pixel electrode may contain a transparent conductive oxide containing at least one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The third layer 420 of the pixel electrode strengthens adhesive force between the third insulating layer 17 and the second layer 418 of the pixel electrode.

A fourth layer 421 of the pixel electrode may be further provided on the first layer 418 of the pixel electrode.

The fourth layer 421 may contain the same material as that of a fifth pad layer 321 of the pad electrode 300 to be described below. For example, the fourth layer 421 of the pixel electrode may contain a transparent conductive oxide containing at least one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The fourth layer 421 of the pixel electrode may act as a barrier layer that prevents materials contained in the first layer 418 of the pixel electrode from being oxidized and diffused.

A fourth insulating layer 19 formed of an organic insulating layer or inorganic insulating layer may be provided on the third insulating layer 17. The fourth insulating layer 19 may cover outer portions of the pixel electrodes 418 and 419 and may act as a pixel defining layer.

An organic light emitting layer 422 is disposed on at least an opening C1 formed in the fourth insulating layer 19. The organic light emitting layer 422 may be formed of a low-molecular organic material, a polymer organic material, or a hybrid organic material produced by mixing the low-molecular organic material and the polymer organic material.

Although not shown in FIG. 2, in addition to the organic light emitting layer 422, at least one of a hole injection layer (HIL), a hole transport layer (HTL), an electron transport layer (ETL), and an electron injection layer (EIL) may be further provided between the pixel electrodes 418 and 419 and the opposite electrode 423. The present embodiment is not limited thereto, and other various functional layers may be further provided.

The pixel P1 illustrated in FIG. 2 is a sub-pixel comprising a unit pixel, and the sub-pixel may emit light of predetermined colors. For example, the sub-pixel may emit red, green, or blue light.

As another example, the sub-pixel may emit white light. When the sub-pixel emits white light, the organic light-emitting display apparatus 1 may further include a color converting layer, which converts the white light into colored light, or a color filter. The sub-pixel emitting the white light may have various structures, and for example, may at least have a structure in which a light-emitting material emitting red light, a light-emitting material emitting green light, and a light-emitting material emitting blue light are stacked.

As another example, the sub-pixel emitting the white light may at least have a structure in which the light-emitting material emitting the red light, the light-emitting material emitting the green light, and the light-emitting material emitting the blue light are combined.

The illustrated colors, red, green, and blue, are merely examples, and the present embodiment is not limited thereto. That is, if it is possible to emit white light, in addition to a combination of red, green, and blue, a combination of other various colors may be used.

The opposite electrode 423, a common electrode, is disposed on all pixels in common. In the organic light-emitting display apparatus 1 according to the present embodiment, the pixel electrodes 418 and 419 are used as an anode, and the opposite electrode 423 is used as a cathode. Alternatively, polarities of the electrodes may be applied vice versa.

The opposite electrode 423 may be formed of a transparent electrode. The opposite electrode 423 may contain one or more materials selected from the group consisting of Al, Mg, Li, Ca, LiF/Ca, and LiF/Al, and may be formed to have a sufficiently thin thickness. As another example, the opposite electrode 423 may contain a transparent conductive oxide.

In an organic light-emitting display apparatus 1 of a top light emitting type, the first layer 419 and second layer 418 of the pixel electrode are formed of a reflective material and the opposite electrode 423 is formed of a transparent electrode. Light emitted from the organic light emitting layer 422 is reflected by the pixel electrodes 418 and 419, and passes through the opposite electrode 423, which is a transparent electrode.

A capacitor CAP including a first electrode 214 and a second electrode 216 may be provided on the substrate 10.

The first electrode 214 of the capacitor CAP may be disposed on the same layer as that of the gate electrode 114, and may be formed of the same material as that of the gate electrode 114.

The second electrode 216 of the capacitor CAP may be disposed on the same layer as that of the source electrode 116a and the drain electrode 116b, and may be formed of the same material as that of the source electrode 116a and the drain electrode 116b.

The second insulating layer 15 may be disposed between the first electrode 214 and second electrode 216 of the capacitor CAP, and may act as a dielectric layer of the capacitor CAP.

The pad unit PAD1, which is a connection terminal to an external device for example a driver IC, is disposed at an outer portion of the display area DA.

The pad unit PAD1 includes the pad electrode 300 that includes a first pad layer 316, a second pad layer 319, and a third pad layer 318 disposed between the first pad layer 316 and the second pad layer 319.

The first pad layer 316 may be disposed on the same layer as that of the source electrode 116a and drain electrode 116b of the thin film transistor TFT. The first pad layer 316 may be formed of the same material as that of the source electrode 116a and the drain electrode 116b. For example, the first pad layer 316 may be formed of a single layer or multilayers which is/are formed of one or more metals selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In the present embodiment, the first pad layer 316 may be formed of copper. Wet etching process may reduce a manufacturing time of an etching process when compared to a dry etching process. In the present embodiment, the first pad layer 316 includes a material having a low resistance and containing copper suitable for a wet etching process, thus preventing a voltage drop at the pad electrode 300 and saving a manufacturing time.

Edges of the first pad layer 316 is covered by the third insulating layer 17, and the third pad layer 318 and the second pad layer 319 are formed on the first pad layer 316. The third pad layer 318 and the second pad layer 319 may act as a barrier layer that prevents materials contained in the first pad layer 316 from being oxidized and diffused.

The second pad layer 319 may be disposed on the same layer as that of the first layer 418 of the pixel electrode and may be formed of the same material as that of the first layer 418 of the pixel electrode. That is, the second pad layer 319 may contain a reflective material. For example, the reflective material may contain silver (Ag) or a silver alloy.

The third pad layer 318 is disposed between the first pad layer 316 and the second pad layer 319. The third pad layer 318 may be disposed to directly contact a bottom of the second pad layer 319.

The third pad layer 318 may contain a material having a lower reducibility than that of a material contained in the second pad layer 319. For example, when the second pad layer 319 contains a material having a high reducibility like silver (Ag), the third pad layer 318 may contain a material having a lower reducibility than that of silver (Ag), such as copper (Cu) or aluminum (Al). A material having a high reducibility like silver (Ag) may easily accommodate ambient electrons during an etching process of forming a pattern of the second pad layer 319. As a result, the silver (Ag) ions dissolved in the etchant accommodate the ambient electrons to thereby be re-precipitated as silver (Ag) particles, and the re-precipitated silver (Ag) particles cause a particle defect of the organic light-emitting display apparatus 1 in a subsequent process.

However, in the organic light-emitting display apparatus 1 according to the present embodiment, the third pad layer 318 containing a material having a lower reducibility than the second pad layer 319 is formed between the first pad layer 316 and the second pad layer 319. Thus further reducing the particle defect caused by the re-precipitation of silver (Ag) while preventing the voltage drop at the pad electrode 300.

In the organic light-emitting display apparatus 1 according to the present embodiment, the first pad layer 316 includes a material that has a low resistance and is suitable for wet etching, and the pad electrode 300 is formed in a triple structure including the first pad layer 316, the second pad layer 319, and the third pad layer 318, thus reducing a manufacturing time and preventing a voltage drop.

A fourth pad layer 320 may be further provided between the first pad layer 316 and the third pad layer 318.

The fourth pad layer 320 may contain, for example, a transparent conductive oxide containing at least one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The fourth pad layer 320 strengthens adhesive force between the first pad layer 316 and the third pad layer 318.

A fifth pad layer 321 may be further provided on the second pad layer 319.

The fifth pad layer 321 may contain a transparent conductive oxide like the fourth pad layer 320. The fifth pad layer 321 may act as a barrier layer that prevents materials contained in the second pad layer 319 from being oxidized and diffused.

Hereinafter, another embodiment of the inventive concept will be described in detail with reference to FIG. 3.

Figure 3:
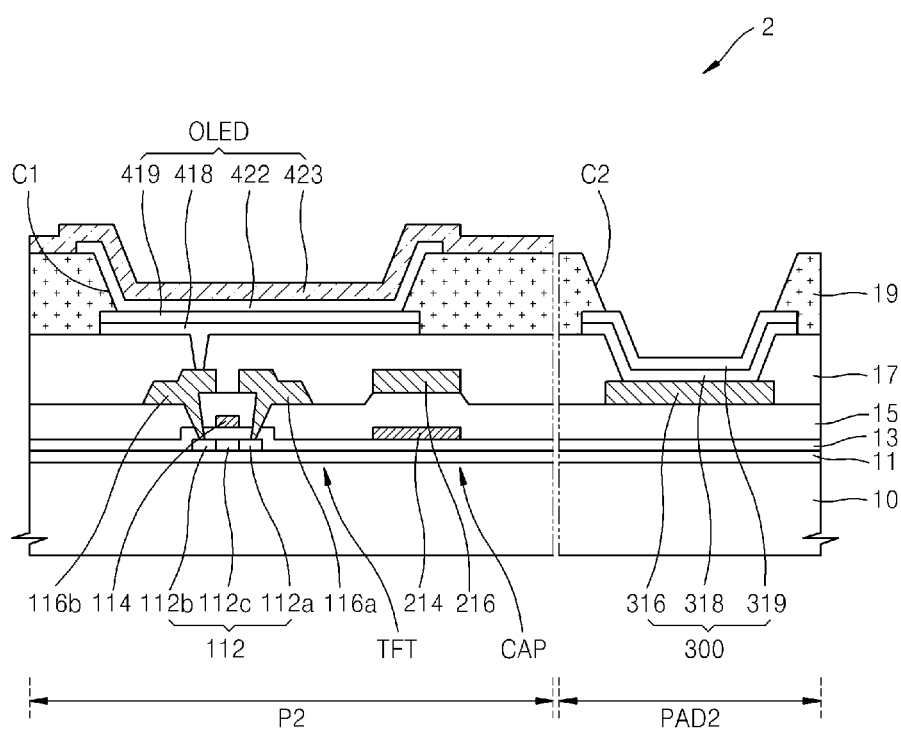
FIG. 3 is a cross-sectional view schematically illustrating a pixel and a pad unit of an organic light-emitting display apparatus according to a second embodiment of the inventive concept.

FIG. 3 is a cross-sectional view schematically illustrating a pixel P2 and a pad unit PAD2 of an organic light-emitting display apparatus 2 according to a second embodiment of the inventive concept. Hereinafter, a description on the organic light-emitting display apparatus 2 according to the present embodiment will focus on a difference between the organic light-emitting display apparatus 2 according to the present embodiment and the organic light-emitting display apparatus 1 according to the first embodiment.

Referring to FIG. 3, the organic light-emitting display apparatus 2 according to the second embodiment includes a substrate 10, and a plurality of pixels P2 and pad units PAD2 disposed on the substrate 10.

Each of the plurality of pixels P2 includes at least one thin film transistor TFT, an organic light-emitting device OLED connected to the thin film transistor TFT, and at least one capacitor CAP.

The thin film transistor TFT, the organic light-emitting device OLED, and the capacitor CAP which are included in the organic light-emitting display apparatus 2 according to the second embodiment are the same as those included in the configuration of the organic light-emitting display apparatus 1 according to the first embodiment.

Each of the plurality of pad units PAD2 is a connection terminal to an external driver, as in the above-described first embodiment, and includes a pad electrode 300 that includes a first pad layer 316, a second pad layer 319, and a third pad layer 318 disposed between the first pad layer 316 and the second pad layer 319.

Although not shown in FIG. 3, a fourth pad layer 320 containing a transparent conductive oxide may be further provided between the first pad layer 316 and the third pad layer 318. Also, a fifth pad layer 321 that prevents materials contained in the third pad layer 318 from being oxidized and diffused may be further provided on the second pad layer 319.

In the present embodiment, a fourth insulating layer 19 acting as a pixel defining layer is formed to cover edges of each of the second pad layer 319 and third pad layer 318. The fourth insulating layer 19, which covers the edges of each of the second pad layer 319 and third pad layer 318, prevents materials having a high reducibility, such as silver, from being diffused into the organic light-emitting display through the edge of the second pad layer 319. Accordingly, a short circuit and a breakage of insulating layers caused by silver diffusion are prevented.

Hereinafter, another embodiment of the inventive concept will be described in detail with reference to FIG. 4.

Figure 4:
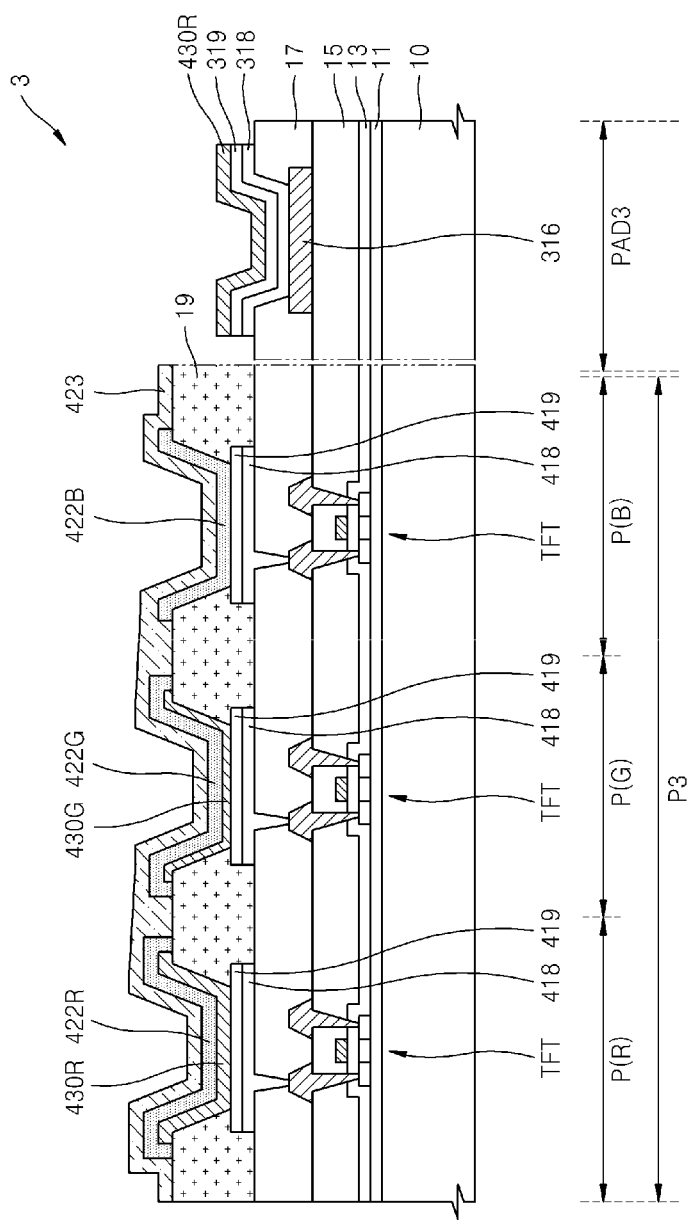
FIG. 4 is a cross-sectional view schematically illustrating a pixel and a pad unit of an organic light-emitting display apparatus according to a third embodiment of the inventive concept.

FIG. 4 is a cross-sectional view schematically illustrating a pixel P3 and a pad unit PAD3 of an organic light-emitting display apparatus 3 according to a third embodiment of the inventive concept. Hereinafter, a description on the organic light-emitting display apparatus 3 according to the present embodiment will focus on a difference between the organic light-emitting display apparatus 3 according to the present embodiment and the organic light-emitting display apparatus 1 according to the first embodiment.

Referring to FIG. 4, the organic light-emitting display apparatus 3 according to the third embodiment includes a substrate 10, and a plurality of pixels P3 and pad units PAD3 are provided on the substrate 10.

Each of the plurality of pixels P3 may be a unit pixel including a plurality of sub-pixels P(R), P(G) and P(B) that emit light of predetermined colors. For example, the sub-pixel P(R) may emit red light, the sub-pixel P(G) may emit green light, and the sub-pixel P(B) may emit blue light.

An organic light emitting layer 422R emitting red light is formed on the sub-pixel P(R), an organic light emitting layer 422G emitting green light is formed on the sub-pixel P(G), and an organic light emitting layer 422B emitting blue light is formed on the sub-pixel P(B).

The illustrated colors, red, green, and blue, are merely examples, and the present embodiment is not limited thereto. That is, if it is possible to emit white light, in addition to a combination of red, green, and blue, a combination of other various colors may be used.

Each of the sub-pixels P(R), P(G) and P(B) may include at least one thin film transistor TFT, an organic light-emitting device connected to the thin film transistor TFT, and at least one capacitor (not shown). The thin film transistor TFT and the capacitor (not shown) which are included in the organic light-emitting display apparatus 3 according to the present embodiment are the same as the configuration of the organic light-emitting display apparatus 1 according to the first embodiment.

A plurality of pixel electrodes 418 and 419 are disposed at each of the sub-pixels P(R), P(G) and P(B) on a third insulating layer 17. The pixel electrodes 418 and 419 may include a first layer 419 containing the same material as that of a second pad layer 319 of a pad electrode 300, and a second layer 418 containing the same material as that of a third pad layer 318 of the pad electrode 300.

Similar to the above-described first embodiment, the first layer 419 of the pixel electrode may contain a reflective material such as silver (Ag) or a silver alloy. The second layer 418 of the pixel electrode may contain a material having a lower reducibility than that of a material contained in the first layer 419. Accordingly, a particle defect caused by the re-precipitation of silver (Ag) particles is reduced. Also, the pixel electrode is thickly formed in a dual structure including the first layer 419 and the second layer 418, thus solving a problem of voltage drop caused by the increase of a screen size.

Although not shown in detail in FIG. 4, the third layer (420, see FIG. 2) containing a transparent conductive oxide may be provided between a third insulating layer 17 and the second layer 418 of the pixel electrode. Also, the fourth layer (421, see FIG. 2) that prevents materials contained in the first layer 419 from being oxidized and diffused may be further provided between the first layer 419 and a plurality of light adjusting layers 430R and 430G.

In the sub-pixel P(R) emitting red light, a first light adjusting layer 430R is disposed between the organic light emitting layer 422R and the pixel electrodes 418 and 419. In the sub-pixel P(G) emitting green light, a second light adjusting layer 430G is disposed between the organic light emitting layer 422G and the pixel electrodes 418 and 419.

The first light adjusting layer 430R and the second light adjusting layer 430G may contain a light-transmitting material. For example, the first light adjusting layer 430R and the second light adjusting layer 430G may contain a transparent conductive oxide containing at least one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

An opposite electrode 423, a common electrode, is disposed on all pixels in common, on each of the organic light emitting layers 422R, 422G and 422B.

Unlike the above-described first embodiment, in the present embodiment, the opposite electrode 423 may be formed as a semi-transmissive electrode that transmits some portion of the light emitted from the organic light emitting layers 422R, 422G and 422B, and reflects the remainder portion of said light emitted from the organic light emitting layers 422R, 422G and 422B.

Figure 5:
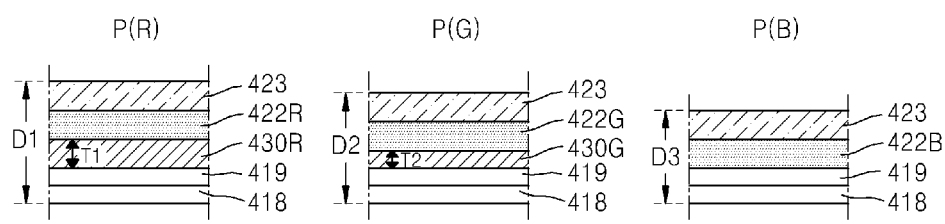
FIG. 5 includes cross-sectional views illustrating in detail some elements of each of sub-pixels of FIG. 4.

FIG. 5 includes cross-sectional views illustrating in detail some elements of each of sub-pixels P(R), P(G) and P(B) of FIG. 4.

Referring to FIG. 5, the first light adjusting layer 430R is disposed between the organic light emitting layer 422R and the pixel electrodes 418 and 419 in the sub-pixel P(R) emitting red light, and the second light adjusting layer 430G is disposed between the organic light emitting layer 422G and the pixel electrodes 418 and 419 in the sub-pixel P(G) emitting green light. The first light adjusting layer 430R may be formed such that the thickness T1 thereof is greater than a thickness T2 the second light adjusting layer 430G.

In the present embodiment, since the first layer 419 and second layer 418 of the pixel electrode are formed of a reflective material and the opposite electrode 423 is formed of a semi-transmissive electrode, light emitted from the organic light emitting layers 422R, 422G and 422B is reflected by the pixel electrodes 418 and 419, and the opposite electrode 423 transmits some of the light and reflects the other light.

The light reflected by the opposite electrode 423 is again reflected by the pixel electrodes 418 and 419, some of the light reflected by the pixel electrodes 418 and 419 passes through the opposite electrode 423, and the other light is again reflected by the opposite electrode 423. Such a light path causes a resonance phenomenon, thus a light efficiency of the organic light-emitting display apparatus 3 is enhanced by the resonance phenomenon.

Since the first light adjusting layer 430R is formed such that the thickness T1 thereof is greater than the thickness T2 of the second light adjusting layer 430G, a resonance distance D1 between the opposite electrode 423 and the pixel electrodes 418 and 419 of the sub-pixel P(R) emitting red light is greater than a resonance distance D2 of the sub-pixel P(G) emitting green light. The resonance distance D2 of the sub-pixel P(G) emitting green light is greater than a resonance distance D3 of the sub-pixel P(B) that emits blue light and does not include a light adjusting layer. Accordingly, a light efficiency of the sub-pixels P(R) and P(G), which respectively emit red light and green light having lower luminance than that of blue light, is enhanced.

In FIGS. 4 and 5, it is illustrated that the thickness T1 of the first light adjusting layer 430R in the sub-pixel P(R) emitting red light is greater than the thickness T2 of the second light adjusting layer 430G in the sub-pixel P(G) emitting green light, but the present embodiment is not limited thereto. Unlike the present embodiment, a thickness of a light adjusting layer formed in each sub-pixel may be changed depending a kind of light emitted from each sub-pixel.

Referring again to FIG. 4, the pad electrode that includes the first pad layer 316, the second pad layer 319, the third pad layer 318 disposed between the first pad layer 316 and the second pad layer 319, and the first light adjusting layer 430R is formed on the pad unit PAD3, which is a connection terminal to an external driver.

The first to third pad layers 316, 319 and 318 are the same as those of the above-described first embodiment. For example, the first pad layer 316 may contain copper, which has a low resistance and is suitable for wet etching, and the second pad layer 319 may contain the same reflective material as that of the first layer 419 of the pixel electrode. For example, the second pad layer 319 may contain silver (Ag) or a silver (Ag) alloy. Accordingly, a voltage drop at the pad electrode is prevented, and a manufacturing time is shortened. The third pad layer 318 may contain a material having a lower reducibility than that of a material contained in the second pad layer 319, thus reducing a particle defect caused by the re-precipitation of silver (Ag) during the etching process.

In the present embodiment, the first light adjusting layer 430R is disposed on the second pad layer 319. That is, the first light adjusting layer 430R used to determine the resonance distance D1 in the sub-pixel P(R) emitting red light is formed on the second pad layer 319. When forming the first light adjusting layer 430R in the sub-pixel P(R) emitting red light, the first light adjusting layer 430R may be formed on the second pad layer 319 without separately performing an additional process. Alternatively, the second light adjusting layer 430G is formed on the pad unit PAD4 instead of the first light adjusting layer 430R.

As described above, the first light adjusting layer 430R or the second light adjusting layer 430G formed on the second pad layer 319 may act as a barrier layer that prevents materials contained in the second pad layer 319 from being oxidized and diffused.

In the organic light-emitting display apparatus 3 according to the present embodiment, the pad electrode is formed in a quadruple structure including the first pad layer 316, the second pad layer 319, the third pad layer 318, and the first light adjusting layer 430R, thus further preventing oxidizing or diffusing of the second pad material.

Although not shown in FIG. 4, the fourth pad layer (320, see FIG. 2) containing a transparent conductive oxide may be provided between the first pad layer 316 and the third pad layer 318. Also, the fifth pad layer (321, see FIG. 2), which prevents materials contained in the third pad layer 318 from being oxidized and diffused, may be further provided on the second pad layer 319.

Hereinafter, another embodiment of the inventive concept will be described in detail with reference to FIG. 6.

Figure 6:
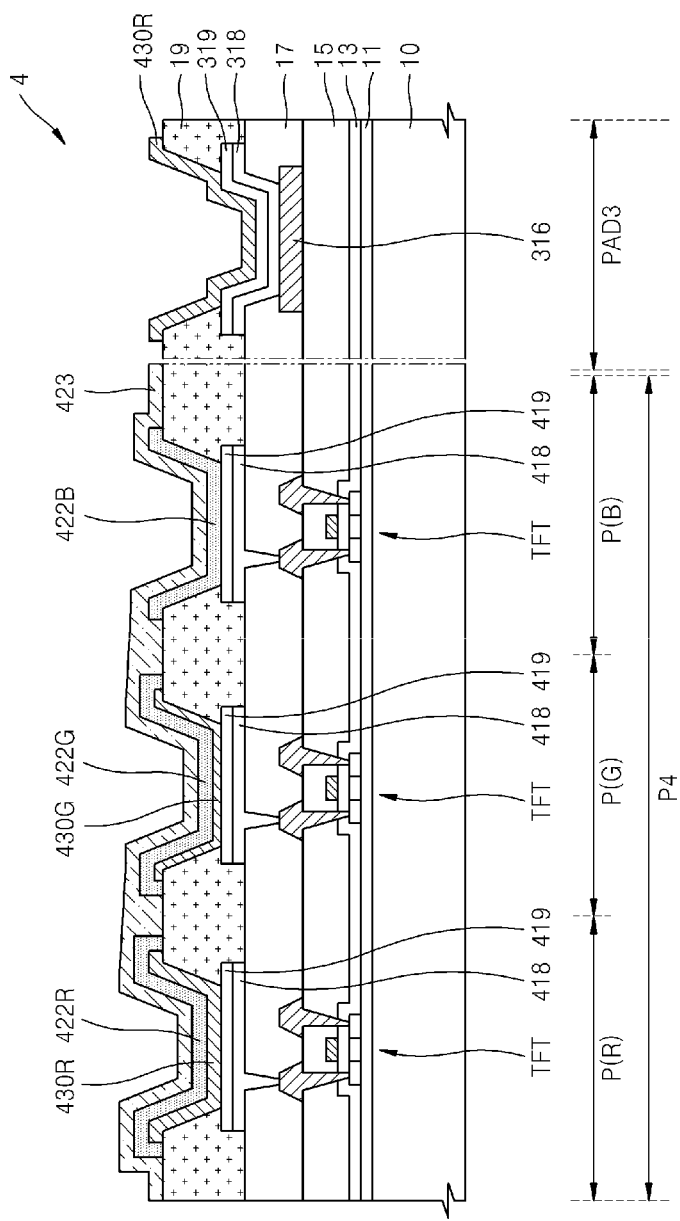
FIG. 6 is a cross-sectional view schematically illustrating a pixel and a pad unit of an organic light-emitting display apparatus according to a fourth embodiment of the inventive concept.

FIG. 6 is a cross-sectional view schematically illustrating a pixel P4 and a pad unit PAD4 of an organic light-emitting display apparatus 4 according to a fourth embodiment of the inventive concept. Hereinafter, a description on the organic light-emitting display apparatus 4 according to the present embodiment will focus on a difference between the organic light-emitting display apparatus 4 according to the present embodiment and the organic light-emitting display apparatus 3 according to the third embodiment.

Referring to FIG. 6, the organic light-emitting display apparatus 4 according to the fourth embodiment includes a substrate 10, and a plurality of pixels P4 and pad units PAD4 are provided on the substrate 10.

A configuration of each of a plurality of sub-pixels P(R), P(G) and P(B) included in the organic light-emitting display apparatus 4 according to the present embodiment is the same as that of the organic light-emitting display apparatus 3 according to the third embodiment.

Therefore, each of the plurality of pixels P4 may be a unit pixel including the plurality of sub-pixels P(R), P(G) and P(B) emitting light of various colors.

Each of the sub-pixels P(R), P(G) and P(B) may include at least one thin film transistor TFT, an organic light-emitting device connected to the thin film transistor TFT, and at least one capacitor (not shown).

The first light adjusting layer 430R is disposed between the organic light emitting layer 422R and the pixel electrodes 418 and 419 in the sub-pixel P(R) emitting red light, and the second light adjusting layer 430G is disposed between the organic light emitting layer 422G and the pixel electrodes 418 and 419 in the sub-pixel P(G) emitting green light. A light adjusting layer is not formed between the organic light emitting layer 422B and the pixel electrodes 418 and 419 in the sub-pixel P(B) emitting blue light.

The opposite electrode 423, a common electrode, is disposed on all pixels in common, on each of the organic light emitting layers 422R, 422G and 422B.

In the present embodiment, as in the above-described third embodiment, the pad electrode that includes the first pad layer 316, the second pad layer 319, the third pad layer 318 disposed between the first pad layer 316 and the second pad layer 319, and the first light adjusting layer 430R is formed on the pad unit PAD4, which is a connection terminal to an external driver. Alternatively, the second light adjusting layer 430G may be formed on the pad unit PAD4 instead of the first light adjusting layer 430R.

Unlike the above-described third embodiment, in the present embodiment, the fourth insulating layer 19, which acts as a pixel defining layer, is formed to cover the edges of each of the second pad layer 319 and third pad layer 318. The fourth insulating layer 19 that covers the edges of each of the second pad layer 319 and third pad layer 318 prevents materials having a high reducibility, such as silver, from being diffused in the organic light-emitting display apparatus 4 through the edges of the second pad layer 319. Accordingly, a short circuit and a breakage of insulating layers caused by silver diffusion are prevented.

Although not shown in FIG. 6, the fourth pad layer (320, see FIG. 2) containing a transparent conductive oxide may be provided between the first pad layer 316 and the third pad layer 318. Also, the fifth pad layer (321, see FIG. 2), which prevents materials contained in the third pad layer 318 from being oxidized and diffused, may be further provided on the second pad layer 319.

Although not shown in FIGS. 1 to 6, the organic light-emitting display apparatuses 1 to 4 according to the embodiments may further include an encapsulation member (not shown) that encapsulates the organic light-emitting device (OLED, see FIG. 2). The encapsulation member may be formed of a substrate containing a glass material, a metal film, or a thin film encapsulation layer. The thin film encapsulation layer may include a plurality of inorganic materials or an inorganic layer and an organic layer.

As described above, according to the one or more of the above embodiments of the inventive concept, the particle defect of the organic light-emitting display apparatus is reduced, and the organic light-emitting display apparatus prevents a voltage drop.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the inventive concept have been described with reference to the figures, it will be understood by those of ordinary skill in the art that various changes in form and details may be made therein without departing from the spirit and scope of the inventive concept as defined by the following claims.

What is claimed is:

1. An organic light-emitting display apparatus comprising:
   a pixel electrode that is connected to at least one thin film transistor;
   an opposite electrode that is disposed to face the pixel electrode;
   an organic light emitting layer that is disposed between the pixel electrode and the opposite electrode; and
   a pad electrode that comprises a first pad layer, a second pad layer disposed on the first pad layer, and a third pad layer which is disposed between the first pad layer and the second pad layer and contains a material having a reducibility that is lower than a reducibility of a material contained in the second pad layer,
   wherein the pad electrode further comprises a fourth pad layer that contains a transparent conductive oxide and is disposed between the first pad layer and the third pad layer, and
   wherein the pad electrode further comprises a fifth pad layer that contains a transparent conductive oxide and is disposed on the second pad layer.

2. The organic light-emitting display apparatus of claim 1, wherein the second pad layer contains a reflective material.

3. The organic light-emitting display apparatus of claim 2, wherein the second pad layer contains silver (Ag).

4. The organic light-emitting display apparatus of claim 1, wherein the first pad layer contains copper.

5. The organic light-emitting display apparatus of claim 1, wherein the pixel electrode comprises a first layer that contains a same material as the second pad layer.

6. The organic light-emitting display apparatus of claim 5, wherein the pixel electrode comprises a second layer that contains a same material as the third pad layer.

7. The organic light-emitting display apparatus of claim 1, further comprising an insulating layer that covers edges of each of the second pad layer and the third pad layer.

* * * * *